(12) United States Patent
Hori et al.

(10) Patent No.: US 7,570,714 B2
(45) Date of Patent: Aug. 4, 2009

(54) DATA TRANSFER APPARATUS FOR LOW VOLTAGE DIFFERENTIAL SIGNALING

(75) Inventors: Yoshihiko Hori, Kawasaki (JP); Keiichi Nakajima, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 693 days.

(21) Appl. No.: 10/870,183

(22) Filed: Jun. 18, 2004

(65) Prior Publication Data

US 2004/0257121 A1  Dec. 23, 2004

(30) Foreign Application Priority Data

Jun. 20, 2003  (JP)  ............................. 2003-175708

(51) Int. Cl.
  *H04L 25/06* (2006.01)
(52) U.S. Cl. .................. 375/317; 375/377; 327/65; 455/39; 330/291; 381/121
(58) Field of Classification Search .............. 375/222, 375/219, 224, 295, 316, 259, 285, 346, 377, 375/317, 77; 330/250, 278, 282, 291, 75; 381/120, 121; 455/39, 68, 69, 73, 91, 130; 327/65

See application file for complete search history.

(56) References Cited

U.S. PATENT DOCUMENTS

| 4,789,999 A | * | 12/1988 | Meschkat et al. ............ 379/405 |
| 5,420,942 A | * | 5/1995 | Levit ........................... 382/276 |
| 2003/0165286 A1 | * | 9/2003 | Ikushima et al. .............. 385/24 |

FOREIGN PATENT DOCUMENTS

| JP | 2000-341177 A | 12/2000 |
| JP | 2001-339315 A | 12/2001 |
| JP | 2002-368600 A | 12/2002 |

* cited by examiner

*Primary Examiner*—Temesghen Ghebretinsae
(74) *Attorney, Agent, or Firm*—Sughrue Mion, PLLC

(57) ABSTRACT

A data transfer apparatus is composed of a transmitter and a receiver. The transmitter includes an output buffer developing a differential signal in response to a data signal, and an amplitude controller. The receiver includes an input buffer converting the differential signal into a single-end signal, and an amplitude detector developing a feedback signal in response to the single-end signal. The amplitude controller controls an amplitude of the differential signal in response to the feedback signal.

5 Claims, 7 Drawing Sheets

Fig. 8

| C0 | C1 | C2 | DRIVE CAPABILITY | |
|---|---|---|---|---|
| H | L | L | 1 | LOW |
| L | H | L | 2 | ↑ |
| H | H | L | 3 | │ |
| L | L | H | 4 | │ |
| H | L | H | 5 | │ |
| L | H | H | 6 | ↓ |
| H | H | H | 7 | HIGH |

DATA TRANSFER APPARATUS FOR LOW VOLTAGE DIFFERENTIAL SIGNALING

BACKGROUND OF THE INVENTION

1. Field of the Invention

The present invention is generally related to data transfer apparatuses, more particularly, to data transfer apparatuses for low voltage differential signaling.

2. Description of the Related Art

Low voltage differential signaling (LVDS) is a well-known technique for achieving high-speed data transmission with reduced electromagnetic interference (EMI). In order to suppress EMI, LVDS-based data transmission apparatuses use differential signals having reduced amplitudes as far as data are successfully transferred.

Pre-emphasis is known in the art as one of the techniques for improving reliability of LVDS data transmission. Japanese open Laid Patent Application No. P2002-368600A discloses a pre-emphasis circuit for boosting the amplitudes of edge portions of differential signals.

Adjusting amplitudes of differential signals is another technique for improving data transmission reliability. Data transmission based on LVDS requires appropriate adjustment of amplitudes of differential signals, especially for the case when lengths of transmission lines between sending and receiving entities, and for the case when the transmission lines experience considerable characteristics variances.

Japanese Open Laid Patent Application No. P2000-341177A discloses an LVDS-based image data transmission apparatus that manually controls the amplitudes of differential signals.

Japanese Open Laid Patent Application No. P2001-339315 discloses another LVDS-based image data transmission apparatus that dynamically controls the amplitudes of differential signals.

As illustrated in FIG. 1, the conventional image signal transmission apparatus is used for transferring image data from a personal computer 100 to a liquid crystal projector 200. The personal computer 100 includes a graphics controller 101, a sending unit 102, a main CPU 106, and a bus 107, while the liquid crystal projector 200 includes a receiving unit 103, and a liquid crystal display panel 104. The sending unit 102 includes an encoder and parallel-serial converter 111, a PLL circuit 112, and an amplitude controller 113. Additionally, the sending unit 102 is connected with a variable resistance circuit 114. The receiving unit 103 includes serial-parallel converter and decoder 131, and a PLL circuit 132.

The sending unit 102 is designed to provide differential signals, including image data and control signals, and clock signals for the receiving unit 103 through transmission lines 104, each including a pair of signal lines.

In order to control the amplitude of the differential signals, the receiving unit 103 includes a coupler 141 connected to specific one of the transmission lines 104. As shown in FIG. 2, the coupler 141 is connected to one of the signal lines RXR+ and RXR− of the specific transmission line 104; it should be noted that the coupler 141 is not connected to both of the signal lines RXR+ and RXR−. A detected signal generated by the coupler 141 is demodulated by a demodulator 142, and then analog-digital converted by an A/D converter 143. The demodulated and analog-digital converted signal is fed back to the personal computer 100 through a CPU 144, and a line driver 145. The sending unit 102 within the personal computer 100 is responsive to the feedback signal received from the liquid crystal projector 200 for controlling the amplitudes of the differential signals transmitted to the receiving unit 103.

One drawback of the conventional technique is that the architecture using the coupler 141 and the demodulator 142 undesirably experiences increased signal loss. Disposing the coupler 141 inevitably affects the impedance matching of the transmission line 104 connected to the coupler 141, and thus causes an increase in the signal loss. The increased signal loss undesirably deteriorates the detection accuracy of the amplitudes. This problem is especially serious if the transmission lines 104 experiences increased loss.

Another drawback is that the aforementioned architecture enhances complexity and size of the circuitry used for the detection of the amplitudes, because the architecture requires a high-speed amplifier adapted to high frequency ranges of the LVDS signals. Typical demodulators include diodes, which have dead band of several hundred millivolts. Therefore, detecting the amplitude of the differential signal using the demodulator 142 requires an amplifier for amplifying the detected signal from the coupler 141; however, the amplifier is required to adapt extremely high frequencies because the differential signal typically ranges between 100 MHz and 10 GHz. This undesirably enhances complexity and size of the required amplifier.

Still another drawback of the architecture shown in FIG. 1 is that the architecture does not deal with common mode noise, because the coupler 141 is coupled to only one of the pair of the signal lines.

These drawbacks prevent desirable feedback control of the amplitude of the differential signal.

Therefore, there is a need for providing a data transmission apparatus for achieving improved feedback control of an amplitude of an LVDS signal with simplified circuitry configuration.

SUMMARY OF THE INVENTION

The present invention generally addresses providing a data transmission apparatus for achieving improved feedback control of an LVDS signal amplitude.

In detail, an object of the present invention is to provide a data transmission apparatus which detects an amplitude of a LVDS signal without affecting impedance matching of transmission lines, and thereby achieves improved feedback control of the amplitude of the LVDS signal.

Another object of the present invention is to provide a data transmission apparatus which detects an amplitude of a LVDS signal with simplified circuit configuration, and thereby achieves improved feedback control of the amplitude of the LVDS signal.

In an aspect of the present invention, a data transfer apparatus is composed of a transmitter and a receiver. The transmitter includes an output buffer developing a differential signal in response to a data signal, and an amplitude controller. The receiver includes an input buffer converting the differential signal into a single-end signal, and an amplitude detector developing a feedback signal in response to the single-end signal. The amplitude controller controls an amplitude of the differential signal in response to the feedback signal.

The amplitude detector preferably develops the feedback signal so that a signal level of the feedback signal is representative of an amplitude of the differential signal. More preferably, the amplitude detector is responsive to an amplitude of the single-end signal for developing the feedback signal.

In one embodiment, the transmission line includes first and second signal lines first and second signal lines connected between the input and output buffers. In this case, it is preferable that the output buffer includes first and second variable voltage source developing first and second voltages, respectively, and a switch circuitry responsive to the data signal for outputting one of the first and second voltages to the first signal line, and the other to the second signal line, and that the amplitude controller controls the first variable voltage source to change the first voltage in response to the feedback signal. Preferably, the amplitude controller further controls the second variable voltage source to change the second voltage in response to the feedback signal. When the first voltage is higher than the second voltage, it is more preferable that the amplitude controller controls the first and second variable voltage sources so that the first voltage is increased as the second voltage is decreased, and vice versa. In this case, the first voltage is preferably increased by a certain voltage when second voltage is decreased by the certain voltage.

In a preferred embodiment, the output buffer is composed of a first driver including a plurality of first transistors connected in parallel to the first signal line, a second driver including a plurality of second transistors connected in parallel to the second signal line, a first selector activating selected one(s) of the first transistors to develop a current on the first signal line, and a second selector activating selected one(s) of the second transistors to develop a current on the second signal line. In this case, the amplitude controller controls the first and second selectors in response to the feedback signal.

In another aspect of the present invention, a receiver is composed of an input buffer converting a differential signal received from a transmitter into a single-end signal, and an amplitude detector which develops a feedback signal representative of an amplitude of the differential signal in response to the single-end signal, and provides said feedback signal for said transmitter. The amplitude detector is preferably responsive to an amplitude of the single-end signal for developing the feedback signal.

In still another aspect of the present invention, a method for transmitting data is composed of:

developing a differential signal in response to a data signal on a sending side, converting the differential signal into a single-end signal on a receiving side, transmitting a feedback signal from the receiving side to the sending side in response to the single-end signal, and controlling an amplitude of the differential signal in response to the feedback signal.

BRIEF DESCRIPTION OF THE DRAWINGS

FIG. 8 is a table illustrating an association of states of voltage control signals with drive capabilities of drivers within the data transmission apparatus in the second embodiment.

DESCRIPTION OF THE PREFERRED EMBODIMENTS

Preferred embodiments of the present invention are described below in detail with reference to the attached drawings.

First Embodiment

Figure 1:
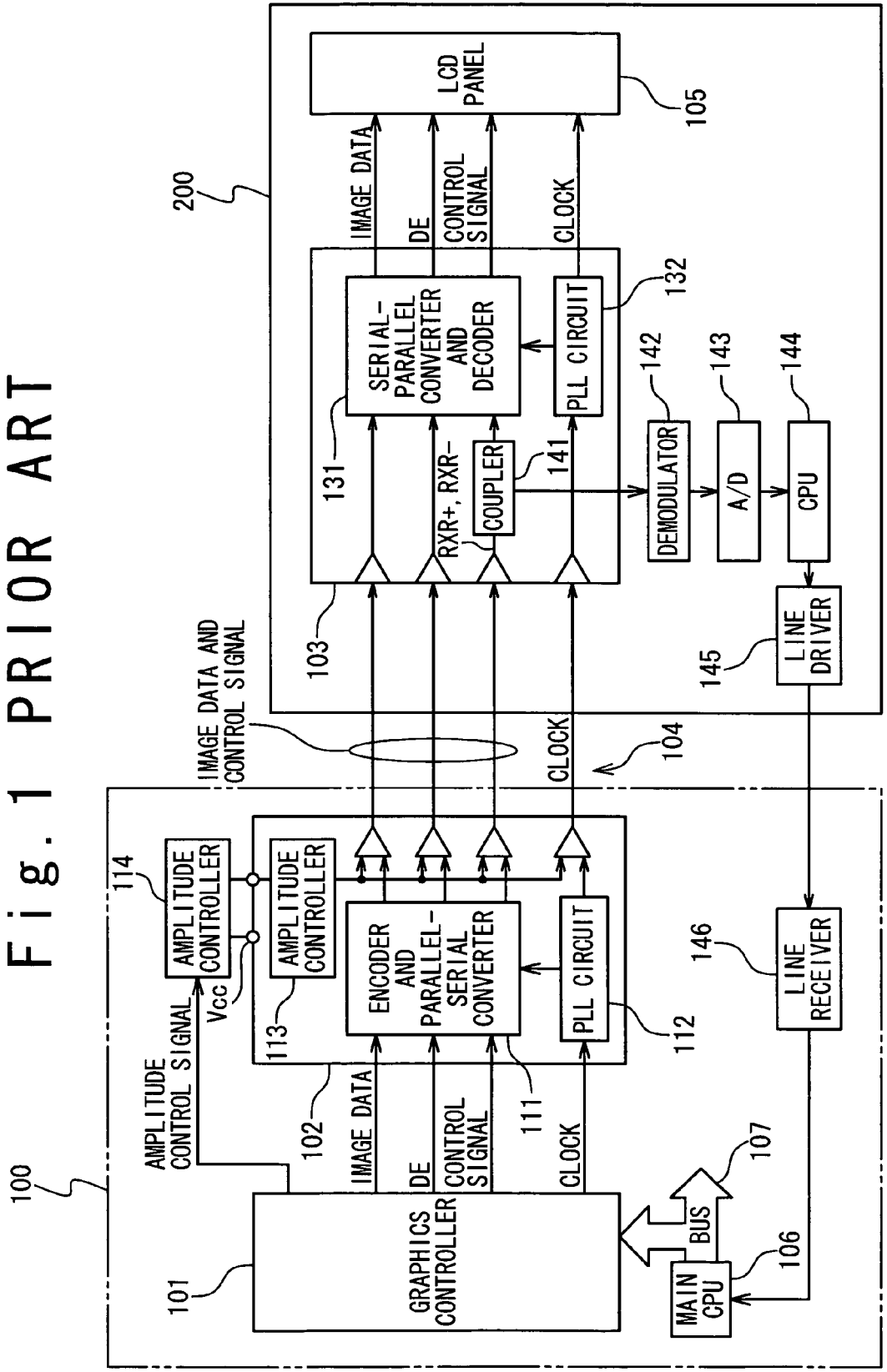
FIG. 1 is a block diagram illustrating a structure of a conventional LVDS-based image data transmission apparatus.
Figure 2:
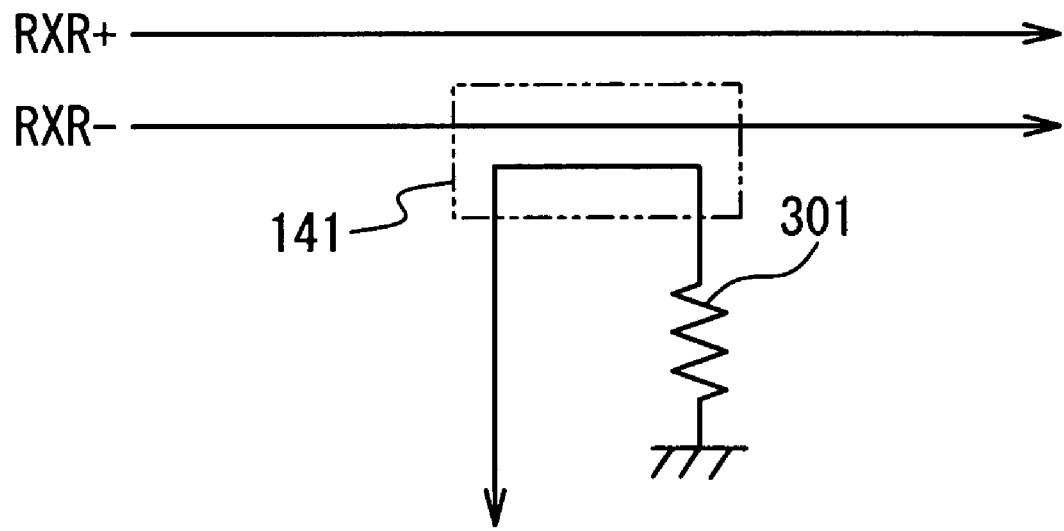
FIG. 2 is a circuit diagram illustrating a structure of a coupler used within the conventional image data transmission apparatus.
Figure 3:
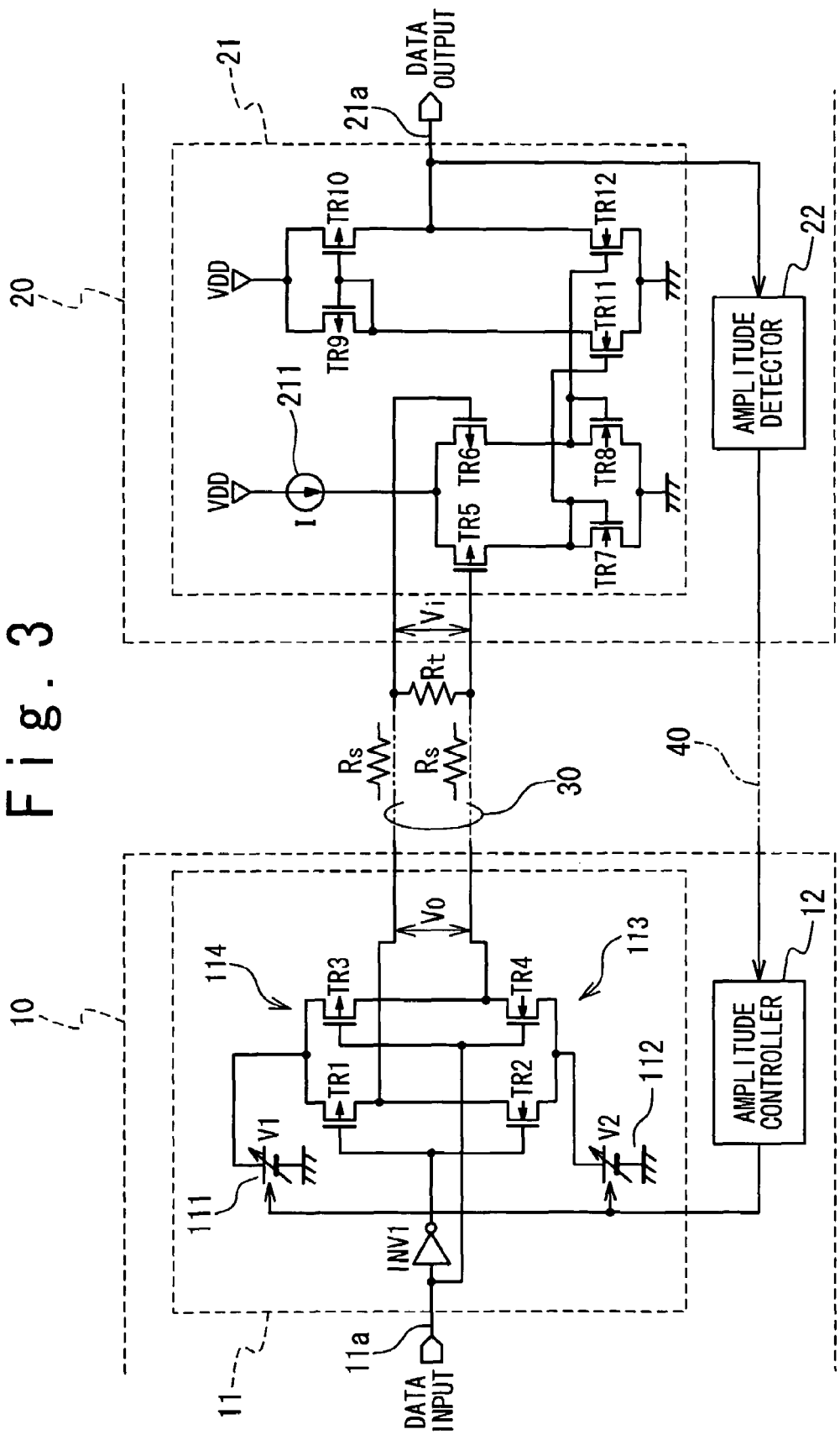
FIG. 3 is a circuit diagram illustrating a structure of a data transmission apparatus in a first embodiment of the present invention.

In a first embodiment, as shown in FIG. 3, a data transmission apparatus is composed of a transmitter 10, and a receiver 20. The transmitter 10, and the receiver 20 are connected through a transmission line 30 including a pair of twisted signal lines. A feedback signal line 40 is additionally interposed between the transmitter 10, and the receiver 20.

The transmitter 10 includes an output buffer 11 and an amplitude controller 12. The output buffer 11 generates a differential signal in response to a transmission data signal 11a inputted thereto. The amplitude controller 12 controls the amplitude of the differential signal generated by the output buffer 11 in response to a feedback signal received from the receiver 20 through the feedback signal line 40.

The receiver 20 includes an input buffer 21 and an amplitude detector 22. The input buffer 21 receives the differential signal from the transmitter 10 through the transmission line 30, and converts the received differential signal into a single-end reception data signal 21a. The amplitude detector 22 detects an amplitude of the single-end reception data signal 21a, and generates the feedback signal so as to be representative of the detected amplitude. The feedback signal is used for feedback control of the differential signal generated by the output buffer 11 within the transmitter 10.

The output buffer 11 within the transmitter 10 is composed of a variable voltage sources 111 and 112, an inverter INV1, PMOS transistors TR1 and TR3, and NMOS transistors TR2 and TR4.

The variable voltage sources 111 and 112 develop output voltages V1 and V2, respectively, so that the output voltage V1 is higher than the output voltage V2. The voltage sources 111 and 112 are responsive to a voltage control signal received from the amplitude controller 12 for controlling the output voltages V1 and V2. The voltage sources 111 and 112 are designed to control the output voltages V1 and V2 so that one of the output voltages V1 and V2 is increased when the other is decreased. Inverting and non-inverting amplifiers may be used as the variable voltage sources 111 and 112, respectively.

The PMOS transistors TR1 and NMOS transistors TR2 function as a first CMOS inverter 113, while the PMOS transistors TR3 and NMOS transistors TR4 function as a second CMOS inverter 114. The first and second CMOS inverters 113 and 114 are responsive to the transmission data signal 11a for outputting selected one of the output voltages V1 and V2, which are generated by the variable voltage sources 111 and 112.

The inverter INV1 inverts the transmission data signal 11a, inputted to the input buffer 11, to provide the inverted data signal for the first CMOS inverter. The second CMOS inverter directly receives the transmission data signal 11a, and thus the first and second CMOS inverters outputs a pair of complementary signals. This allows the output buffer 11 to develop the differential signal corresponding to the transmission data signal 11a on the transmission line 30.

The transmission line 30 transmits the differential signal from the output buffer 11 to the input buffer 21 within the receiver 20. The amplitude Vi of the differential signal inputted to the input buffer 21 is represented by the following equation:

$$Vi = Vo \times Rt/(2Rs+Rt),$$

Where Rs is the resistance of each of the signal lines of the transmission line 30, Rt is the resistance of an interconnection disposed between the twisted signal lines, and Vo is the amplitude of the differential signal on the outputs of the output buffer 11.

The input buffer 21 is composed of a constant current source 211, PMOS transistors TR5, TR6, TR9 and TR10 and NMOS transistors TR7, TR8, TR11, and TR12. The PMOS transistors TR5 and TR6 are designed to have the same characteristics to function as a differential amplifier. The gate of the transistor TR5 is used as the non-inverting input of the input buffer 21, while the gate of the transistor TR5 is used as the inverting input of the input buffer 21. The NMOS transistors TR7 and TR11 are connected so as to function as a current mirror, and the NMOS transistors TR8 and TR12 are connected so as to function as another current mirror. In order for these current mirrors to have the same mirror ratio, the NMOS transistors TR7 and TR8 are designed to have the same characteristics, while the NMOS transistors TR11 and TR12 are designed to have the same characteristics. Additionally, the PMOS transistors TR9 and TR10 constitute still another current mirror. The PMOS transistors TR9 and TR10 are designed to have the same characteristics so that the current mirror composed of the PMOS transistors TR9 and TR10 has a mirror ratio of one.

Figure 4:
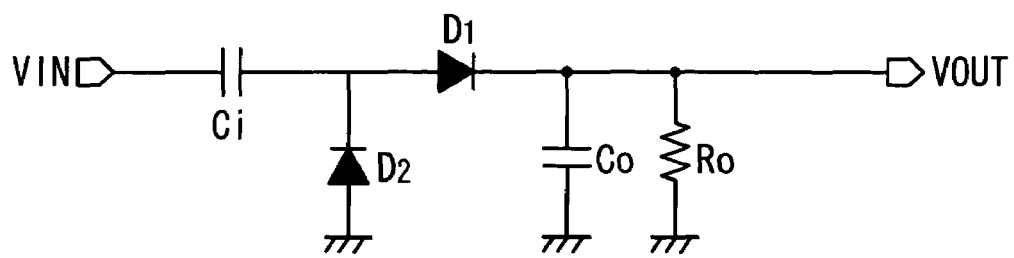
FIG. 4 is a circuit diagram illustrating a structure of an amplitude detector within the data transmission apparatus in the first embodiment.

As shown in FIG. 4, the amplitude detector 22 is composed of an input terminal VIN, capacitors Ci and Co, diodes D1 and D2, a register Ro, and an output terminal VOUT. The capacitor Ci has first and second terminals, the first terminal being connected to the input terminal VIN. The diode D1 has an anode connected to the second terminal of the capacitor Ci, and a cathode connected to the output terminal VOUT. The diode D2 has an anode connected to ground, and a cathode connected to the second terminal of the capacitor Ci. The capacitor Co and the resistor Ro are connected in parallel between the output terminal VOUT and ground. The capacitances of the capacitors Ci and Co, and the resistance of the resister Ro are determined on the basis of the frequency of the reception data signal 21a, generated by the output buffer 21.

The amplitude controller 12 is responsive to the feedback signal received from the amplitude detector 22 for providing the voltage control signal for the variable voltage sources 111 and 112. In this embodiment, the single voltage control signal generated by the amplitude controller 12 is provided for both of the variable voltage sources 111 and 112. This architecture is preferable when inverting and non-inverting amplifiers are used as the variable voltage sources 111 and 112, respectively. In this case, an amplifier may be used as the amplitude controller 12. Instead, the amplitude controller 12 may be designed to provide a dedicated voltage control signal for each of the variable voltage sources 111 and 112.

The operation of the data transmission apparatus shown in FIG. 3 will be explained below in detail.

The transmission data signal 11a is inputted to the output buffer 11, and delivered to the input of the first CMOS inverter 113 (that is, the gates of the transistors TR1 and TR2) through the inverter INV1, and also directly delivered to the input of the second CMOS inverter 114 (that is, the gates of the transistors TR3 and TR4).

The differential signal corresponding to the transmission data signal 11a is developed on the transmission line 30 by the first and second CMOS inverters 113 and 114 within the output buffer 11. Within the first CMOS inverter 113, the PMOS transistor TR1 is turned on, and the NMOS transistor TR2 is turned off, when the transmission data signal 11a is the high level "H"; this results in that the first CMOS inverter 113 outputs the output voltage V1 received from the variable voltage source 111. Within the second CMOS inverter 114, on the other hand, the PMOS transistor TR3 is turned off, and the NMOS transistor TR4 is turned on in response to the transmission data signal 11a; this results in that the second CMOS inverter 113 outputs the output voltage V2 received from the variable voltage source 112. This causes a current flow from the first CMOS inverter 113 to the second CMOS inverter 114 through the transmission line 30 to develop the desired differential signal on the transmission line 30.

When the transmission data signal 11a is the low level "L", in contrary, the PMOS transistor TR1 and NMOS transistor TR4 are turned off, and the NMOS transistor TR2 and the PMOS transistor TR3 are turned on; this results in that the first CMOS inverter 113 outputs the output voltage V2, while the second CMOS inverter 114 outputs the output voltage V1. This causes the opposite current flow from the second CMOS inverter 114 to the first CMOS inverter 113 through the transmission line 30 to develop the complementary differential signal on the transmission line 30.

The differential signal developed on the transmission line 30 is received by the receiver 20. A voltage is developed by the interconnection between the twisted signal lines between the gates of the PMOS transistors TR5 and TR6 within the input buffer 21 of the receiver 20 on the differential signal. The voltage developed between the gates of the PMOS transistors TR5 and TR6 is proportional to the amplitude of the differential signal.

The developed voltage allows the PMOS transistors TR5 and TR6 to divide the current received from the current source 211 in response to the voltage developed between the gates of the PMOS transistors TR5 and TR6. This results in that the currents through the transistors TR5 and TR6 are proportional to the amplitude of the differential signal. The current through the transistor TR5 is mirrored by the transistors TR7 and TR11, and the transistors TR9 and TR10, while the current through the transistor TR6 is mirrored by the transistors TR8 and TR12. This results in that the single-end reception data signal 21a is developed on the output terminal of the input buffer 21 so as to have an amplitude depending on the differential signal.

In this way, the input buffer 21 amplifies and converts the differential signal into the single-end reception data signal 21a.

The single-end reception data signal 21a is provided for the amplitude detector 22 as well as a data processor (not shown). The amplitude detector 22 develops the feedback signal so as to have a voltage level depending on the amplitude of the reception data signal 21a.

Figure 5:
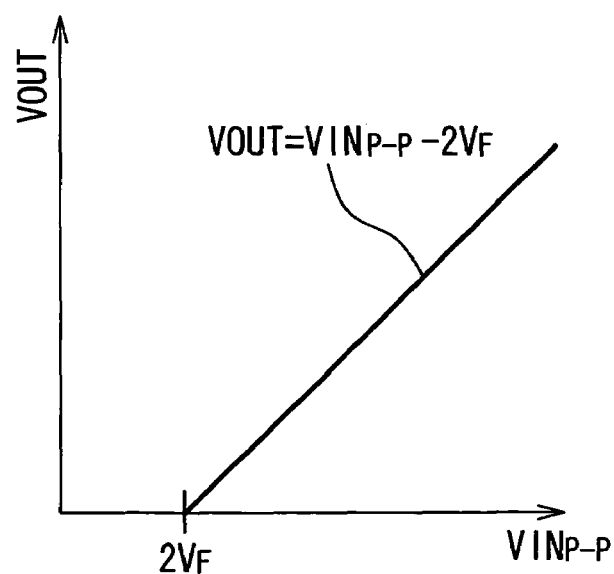
FIG. 5 is a graph illustrating input-output characteristics of the amplitude detector in the first embodiment.
Figure 6:
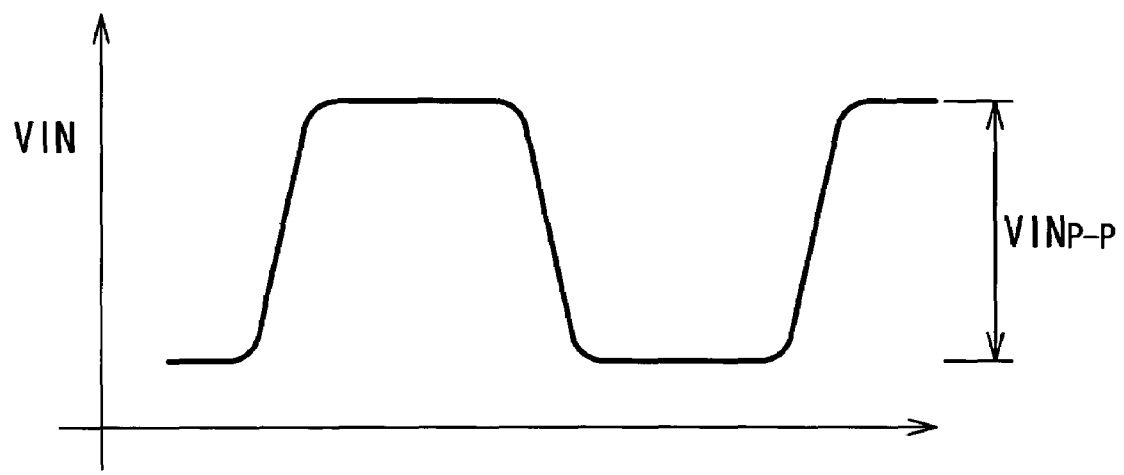
FIG. 6 is a graph illustrating a waveform of a single-end reception data signal developed within a receiver of the data transmission apparatus in the first embodiment.

FIG. 5 is a graph illustrating the input-output characteristics of the amplitude detector 22. The horizontal axis is associated with the amplitude of the reception data signal 21a received from the input buffer 21, while the vertical axis is associated with the output voltage VOUT developed on the output of the amplitude detector 22, that is, the voltage level of the feedback signal. It should be noted that the amplitude of the reception data signal 21a is defined as being the difference between the high and low levels of the reception data signal 21a, as illustrated in FIG. 6.

As depicted in FIG. 5, the voltage level of the feedback signal (that is, the output of the amplitude detector 22) linearly increases as the increase of the amplitude of the reception data signal 21a, that is, the amplitude of the differential signal in exception that the amplitude detector 22 has a dead band, which depends on the characteristics of the diodes D1 and D2. The width of the dead band is approximately the sum of the forward threshold voltages of the diodes D1 and D2; in the case when silicon diodes, which have a forward threshold voltage $V_F$ of about 0.6 V, are used as the diodes D1 and D2, the width of dead band of the amplitude detector 22 is 1.2 V. The input buffer 21 is required to amplify the differential signal so that the amplitude of the reception data signal 21a is increased above the dead band of the amplitude detector 22.

The feedback signal, developed to represent the amplitude of the differential signal, is transmitted to the amplitude controller 12 within the transmitter 10 through the feedback line 40.

The amplitude controller 12 amplifies the received feedback signal to generate the voltage control signal, and provides the voltage control signal for the variable voltage sources 111 and 112.

The variable voltage sources 111 and 112 controls the output voltages V1 and V2 in response to the voltage control signal. Specifically, the variable voltage source 111 increases the output voltage V1 and the variable voltage source 112 decreases the output voltage V2, as the voltage level of the voltage control signal is increased, and vice versa.

In a preferred embodiment, the output voltages V1 and V2 are developed so that the average of the output voltages V1 and V2, that is the common mode voltage of the differential signal is regulated to a constant value. When the difference of the output voltages V1 and V2, that is, the amplitude of the differential signal is increased by A (V), for example, the output voltage V1 is increased by A/2 (V), and the output voltage V2 is decreased by A/2 (V). Instead, the variable voltage sources 111 and 112 may be designed so that one of the output voltages V1 and V2 is fixed and, the other is variable.

As thus described, the amplitude of the differential signal outputted from the output buffer 11 is based on the difference between the output voltages V1 and V2. Therefore, the feedback control of the output voltages V1 and V2 effectively achieves the appropriate control of the amplitude of the differential signal.

The architecture controlling the amplitude of the differential signal in response to the single-end reception data signal 21 effectively avoids the impedance mismatching of the transmission line 30 through eliminating a need for connecting an amplitude detector to the transmission line 30, which may potentially cause impedance the mismatching and signal loss.

Additionally, the architecture in this embodiment is free from an influence of the common mode noise of the differential signal.

Furthermore, the architecture in this embodiment eliminates a need for using a high-speed amplifier, and thereby achieves improved feedback control of an LVDS signal amplitude with simplified circuitry configuration.

Second Embodiment

Figure 7:
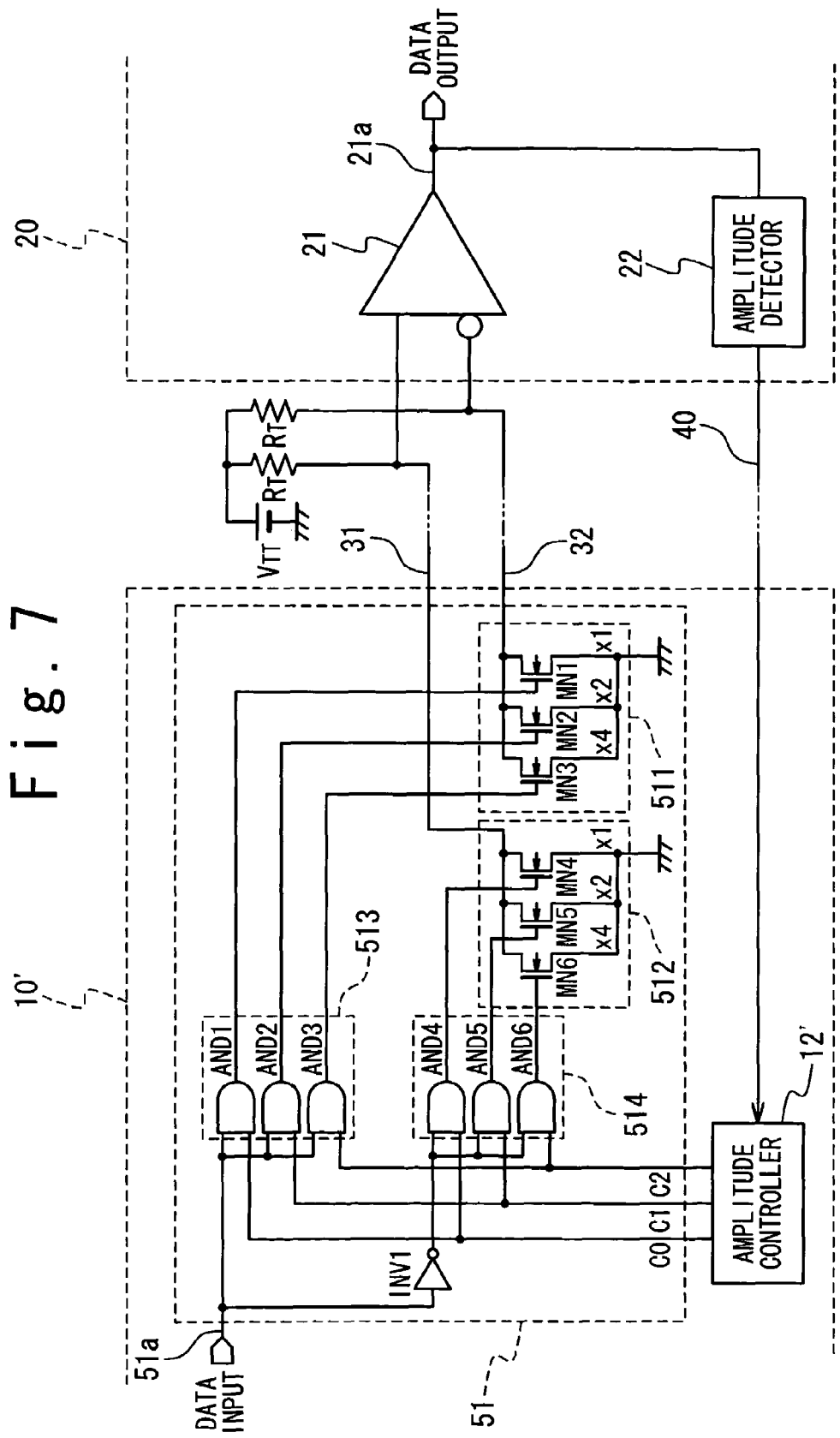
FIG. 7 is a circuit diagram illustrating a structure of a data transmission apparatus in a second embodiment of the present invention.

FIG. 7 is a circuit diagram illustrating a structure of a data transmission apparatus in a second embodiment. The data transmission apparatus in the data transmission apparatus is comprised of a transmitter 10' which includes an open-drain type output buffer 51 in place of the output buffer 11 shown in FIG. 3. Additionally the transmitter 10' includes an amplitude controller 12' providing a set of amplitude control signals C0 through C2 for the output buffer 51. The output buffer 51 includes first and second drivers 512 and 513, and first and second selectors 513 and 514 connected to the first and second drivers 512 and 513, respectively.

Each of the drivers 512 and 513 is composed of a plurality of n transistors having different drive capabilities; n is an integer equal to or more than 2. It should be noted that the term "drive capability" of a specific transistor means that the maximum current through the transistor when the transistor is turned on. The drive capabilities of the respective transistors are adjusted to $2^i$ times as large as a predetermined drive capability, i being equal to or more than 1, and less than n.

In this embodiment, the driver 512 includes three NMOS transistors MN1 through MN3, while the driver 513 includes three NMOS transistors MN4 through MN6. The drive capability of the NMOS transistor NM2 is twice as large as that of the NMOS transistor NM1, and the drive capability of the NMOS transistor NM3 is four times as large as that of the NMOS transistor NM1. Correspondingly, the drive capability of the NMOS transistor NM5 is twice as large as that of the NMOS transistor NM4, and the drive capability of the NMOS transistor NM6 is four times as large as that of the NMOS transistor NM4.

The drains of the NMOS transistors MN1 through MN3 are connected to a first signal line 31, while the drains of the NMOS transistors MN4 through MN6 are connected to a second signal line 32. The sources of the NMOS transistors MN1 through MN6 are connected to ground. The signal lines 31 and 32 are connected to a voltage source VTT through terminal resistors RT.

The selector 513 selects and activates one or more transistors out of the NMOS transistors MN1 through MN3. The selector 513 is comprised of AND gates AND1 through AND3 connected to the gates of the NMOS transistors MN1 through MN3, respectively. The AND gates AND1 through AND3 receive a transmission data signal 51a on the first input, and also receives the amplitude control signals C0 through C2 on the second input, respectively. The combinations of the activated transistors allow the driver 511 to select seven drive capabilities.

Correspondingly, the selector 514 selects and activates one or more transistors out of the NMOS transistors MN4 through MN6. The selector 514 is comprised of AND gates AND4 through AND6 connected to the gates of the NMOS transistors MN4 through MN6. The AND gates AND4 through AND6 receive the transmission data signal 51a through an inverter INV1 on the first input, and also receives the amplitude control signals C0 through C2 on the second input, respectively. The combinations of the activated transistors allow the driver 512 to select seven drive capabilities.

The amplitude controller 12' is responsive to the feedback signal received from the amplitude detector 22 for developing the amplitude control signals C0 through C2. The amplitude control signals C0 through C2 are used for indicate the amplitude of the differential signal transmitted to the receiver 20. The amplitude controller 12' is exemplarily composed of a memory containing a table defining an association of the voltage level of the feedback signal with the states of the amplitude control signals C0 through C2, an analog-digital converter for performing analog-digital conversion on the feedback signal, and a processor selecting the states of the amplitude control signals C0 through C2 through table lookup of the table contained in the memory using the voltage level of the feedback signal as the query. The analog-digital converter may be disposed within the receiver 20, and the amplitude controller 12' is composed of the aforementioned memory and processor.

FIG. 6 illustrates the association of the states of the amplitude control signals C0 through C2 with the drive capabilities of the drivers 511 and 512. The drive capabilities of the drivers 511 and 512 are each selected out of the allowed seven drive capabilities in response to the amplitude control signals C0 through C2.

This architecture achieves multiple-step control of the differential signal generated by the output buffer 51, the number of steps of the multiple-step control being $2^n-1$ (in this embodiment, the number of steps being seven).

The structure of the receiver 20 in the second embodiment is identical to that in the first embodiment; the receiver 20 includes the input buffer 21, and the amplitude detector 21, which are identical to those in the first embodiment. The non-inverting input of the input buffer 21 is connected to the signal line 31, while the inverting input of the input buffer 21 is connected to the signal line 32. The input buffer 21 converts the differential signal received from the transmitter 10' into the single-end reception data signal 21a, whose amplitude depends on the amplitude of the differential signal. The reception data signal 21a is provided for the amplitude detection signal 22.

The operation of the data transmission apparatus in this embodiment will be described below in detail.

The transmission data signal 51a is directly provided for the first inputs of the AND gates AND1 to AND3 within the selector 513, and provided for the first inputs of the AND gates AND4 to AND6 within the selector 514 through the inverter INV1. This results in that the outputs of the AND gates AND4 through AND6 are pull down to the low level when any one of the outputs of the AND gates AND1 through AND3 is pulled up to the high level. In contrast, the outputs of the AND gates AND1 through AND3 are pull down to the low level when any one of the outputs of the AND gates AND4 through AND6 is pulled up to the high level. Accordingly, the activation of at least one of the amplitude control signals C0 through C2 allows a current to develop on selected one of the signal lines 31 and 32 in response to the transmission data signal 51a. The developed current provides a voltage between the signal lines 31 and 32 through the voltage drop across the associated terminal resistor RT to thereby develop the differential signal on the signal lines 31 and 32 in response to the transmission data signal 51a.

The developed voltage between the signal lines 31 and 32 is amplified and converted into the single-end reception data signal 21a by the input buffer 21.

The amplitude detector 22 detects the amplitude of the reception data signal 21a, and develops the feedback signal so as to represent the detected amplitude. The voltage level of the feedback signal corresponds with the amplitude of the differential signal, because the amplitude of the reception data signal 21a corresponds with the amplitude of the differential signal. The feedback signal is transmitted to the amplitude controller 12' through the feedback signal line 40.

The amplitude controller 12' selects a combination of activated transistor(s) out of the NMOS transistors MN1 through MN6 in response to the feedback signal received from the amplitude detector 22, and generates the amplitude control signals C0 through C2 associated with the selected combination of the activated transistor(s). The selected combination determines the current through the signal line 31 and 32, that is, the amplitude of the differential signal to achieve the feedback control of the amplitude of the differential signal.

As is the case of the first embodiment, the data transmission apparatus in this embodiment avoids the impedance mismatching of the signal line 31 and 32, and also eliminates the need for using a high-speed amplifier. This achieves improved feedback control of the amplitude of the differential signal with simplified circuit configuration.

Although the invention has been described in its preferred form with a certain degree of particularity, it is understood that the present disclosure of the preferred form has been changed in the details of construction and the combination and arrangement of parts may be resorted to without departing from the scope of the invention as hereinafter claimed.

Especially, it should be noted that the present invention is applied to parallel transmission of differential signals through a bus. In this case, the amplitude of selected one of the differential signals is detected, and used for feedback control of the amplitudes of all the differential signals. In this case, the selected differential signal is preferably a differential clock signal, which is superior in stability.

What is claimed is:

1. A data transfer apparatus comprising:
a transmitter including:
an output buffer developing a differential signal in response to a data signal; and
an amplitude controller;
a receiver including:
an input buffer receiving said differential signal through a transmission line and converting said differential signal into a single-end signal; and
an amplitude detector developing a feedback signal in response to said single-end signal,
wherein said amplitude controller controls an amplitude of said differential signal in response to said feedback signal,
wherein said transmission line comprises first and second signal lines connected between said input and output buffers,
wherein said output buffer includes:
first and second variable voltage sources developing first and second voltages, respectively, and
switch circuitry responsive to said data signal for outputting one of said first and second voltages to said first signal line, and the other one of said first and second voltages to said second signal line, and
wherein said amplitude controller controls said first variable voltage source to change said first voltage in response to said feedback signal.

2. The data transfer apparatus according to claim 1, wherein said amplitude controller further controls said second variable voltage source to change said second voltage in response to said feedback signal.

3. The data transfer apparatus according to claim 2, wherein said first voltage is higher than said second voltage, and
wherein said amplitude controller controls said first and second variable voltage sources so that said first voltage is increased as said second voltage is decreased, and said second voltage is increased as said first voltage is decreased.

4. The data transfer apparatus according to claim 3, wherein said first voltage is increased by a specified voltage when second voltage is decreased by said specified voltage.

5. A data transfer apparatus comprising:

a transmitter including:

an output buffer developing a differential signal in response to a data signal; and an amplitude controller;

a receiver including:

an input buffer receiving said differential signal through a transmission line and converting said differential signal into a single-end signal; and an amplitude detector developing a feedback signal in response to said single-end signal, wherein said amplitude controller controls an amplitude of said differential signal in response to said feedback signal, wherein said transmission line includes first and second signal lines connected between said input and output buffers, wherein said output buffer comprises:

a first driver including a plurality of first transistors connected in parallel to said first signal line, a second driver including a plurality of second transistors connected in parallel to said second signal line, a first selector activating selected said first transistors to develop a current on said first signal line, and a second selector activating selected said second transistors to develop a current on said second signal line, and wherein said amplitude controller controls said first and second selectors in response to said feedback signal.

* * * * *